(12) United States Patent
Oliaei et al.

(10) Patent No.: US 8,698,664 B2
(45) Date of Patent: Apr. 15, 2014

(54) CONTINUOUS-TIME INCREMENTAL ANALOG-TO-DIGITAL CONVERTER

(75) Inventors: Omid Oliaei, Tempe, AZ (US); Patrick L. Rakers, Scottsdale, AZ (US)

(73) Assignee: Intel IP Corporation, Santa Clara, CA (US)

( * ) Notice: Subject to any disclaimer, the term of this patent is extended or adjusted under 35 U.S.C. 154(b) by 123 days.

(21) Appl. No.: 13/363,884

(22) Filed: Feb. 1, 2012

(65) Prior Publication Data
US 2013/0194116 A1 Aug. 1, 2013

(51) Int. Cl.
*H03M 1/12* (2006.01)

(52) U.S. Cl.
USPC .......................................... 341/155; 341/143

(58) Field of Classification Search
USPC .................................................. 341/143, 155
See application file for complete search history.

(56) References Cited

U.S. PATENT DOCUMENTS

| | | | | |
|---|---|---|---|---|
| 5,012,244 | A * | 4/1991 | Wellard et al. | 341/143 |
| 5,986,598 | A * | 11/1999 | Mittel | 341/143 |
| 6,362,763 | B1 * | 3/2002 | Wang | 341/143 |
| 6,697,000 | B2 * | 2/2004 | LeReverend et al. | 341/143 |
| 7,411,534 | B1 * | 8/2008 | Melanson | 341/131 |

OTHER PUBLICATIONS

Ranjbar et al; "Continous-time feedforward ΣΔ modulators with robust lowpass STF"; Electronic Letters, vol. 43, No. 24; pp. 2, Nov. 22, 2007.
Garcia et al.; "High-order continous-time incremental ΣΔ ADC for multi-channel applications"; IEEE International Symposium on Circuits and Systems; pp. 4, 2011.
Doldán et al.; "A Continuous-Time Incremental Anolog to Digital Converter"; Proceeding of the 15th Symposium on Integrated Circuits and Design (SBCCI'02); IEEE; pp. 6, 2002.
Uhlig et al.; "A Low-Power Continous-Time Incremental 2nd-Order-MASH ΣΔ-Modulator for a CMOS Imager"; IEEE 2009; pp. 33-36, 2009.

* cited by examiner

*Primary Examiner* — Khai M Nguyen
(74) *Attorney, Agent, or Firm* — Baker Botts LLP.

(57) ABSTRACT

In accordance with embodiments of the present disclosure, a continuous-time incremental analog-to-digital converter (ADC) may include a plurality of resettable integrators and a feed-in gain element. Each integrator may be configured to convert a sum of signals received at its input to a signal indicative of an integral over time of the sum of signals. The plurality of integrators may include a first-stage integrator configured to receive at its input the baseband signal and a final-stage integrator configured to produce at its output a final-stage analog signal. The plurality of integrators may be arranged in a cascade configuration such that an output of each of the plurality of integrators other than the final-stage integrator is coupled to the input of a subsequent integrator. The feed-in gain element may be coupled between the input of the first-stage integrator and the input of another integrator of the plurality of integrators.

8 Claims, 4 Drawing Sheets

CONTINUOUS-TIME INCREMENTAL ANALOG-TO-DIGITAL CONVERTER

TECHNICAL FIELD

The present disclosure relates generally to wireless communication and, more particularly, to analog-to-digital converters.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. On the other hand, a receiver is an electronic device which, also usually with the aid of an antenna, receives and processes a wireless electromagnetic signal. In certain instances, a transmitter and receiver may be combined into a single device called a transceiver.

Receivers include a number of components that are arranged to convert a received wireless signal, usually in the radio-frequency spectrum, to a digital signal capable of being processed by digital circuitry (e.g., microprocessors, digital signal processors, etc.). Typically, a component known as an analog-to-digital converter (ADC) is used to perform such conversion. Recently, a specific type of ADC known as a delta-sigma ADC has been increasingly applied in many applications. A delta-sigma ADC includes a one or more component blocks often referred to as a delta-sigma modulator. Each delta-sigma modulator may subtract an output feedback signal from an input signal, and mathematically integrate the difference to produce an output signal. A delta-sigma ADC may include one or more of such delta-sigma modulators oriented in a serial manner, and a delta-sigma ADC may be referred to as an nth-order delta-sigma ADC, wherein n equals the number of delta-sigma modulators.

A particular type of delta-sigma ADC is known as an incremental ADC, wherein each integrator of the ADC is reset after each conversion cycle, such that the ADC is reset and ready to accept the next sample. This incremental feature provides a one-to-one mapping between input and output after each conversion and makes the ADC suitable for multi-channel operation.

Despite their advantages, incremental ADCs may have disadvantages. For example, traditional continuous time incremental ADCs may have long conversion times, especially compared to their discrete time counterparts. In addition, traditional incremental ADCs may have many linear and direct-current (DC) offset errors due to non-idealities of the ADC.

SUMMARY

In accordance with embodiments of the present disclosure, a continuous-time incremental analog-to-digital converter (ADC) may include a plurality of resettable integrators and a feed-in gain element. Each integrator may be configured to convert a sum of signals received at its input to a signal indicative of an integral over time of the sum of signals. The plurality of integrators may include a first-stage integrator configured to receive at its input the baseband signal and a final-stage integrator configured to produce at its output a final-stage analog signal. The plurality of integrators may be arranged in a cascade configuration such that an output of each of the plurality of integrators other than the final-stage integrator is coupled to the input of a subsequent integrator. The feed-in gain element may be coupled between the input of the first-stage integrator and the input of another integrator of the plurality of integrators.

Technical advantages of the present disclosure may be readily apparent to one skilled in the art from the figures, description and claims included herein.

BRIEF DESCRIPTION OF THE DRAWINGS

For a more complete understanding of the present disclosure and its features and advantages, reference is now made to the following description, taken in conjunction with the accompanying drawings, in which:

FIG. 5 illustrates a flow chart of an example method for calibrating a continuous time analog-to-digital converter, in accordance with certain embodiments of the present disclosure.

DETAILED DESCRIPTION

Figure 1:
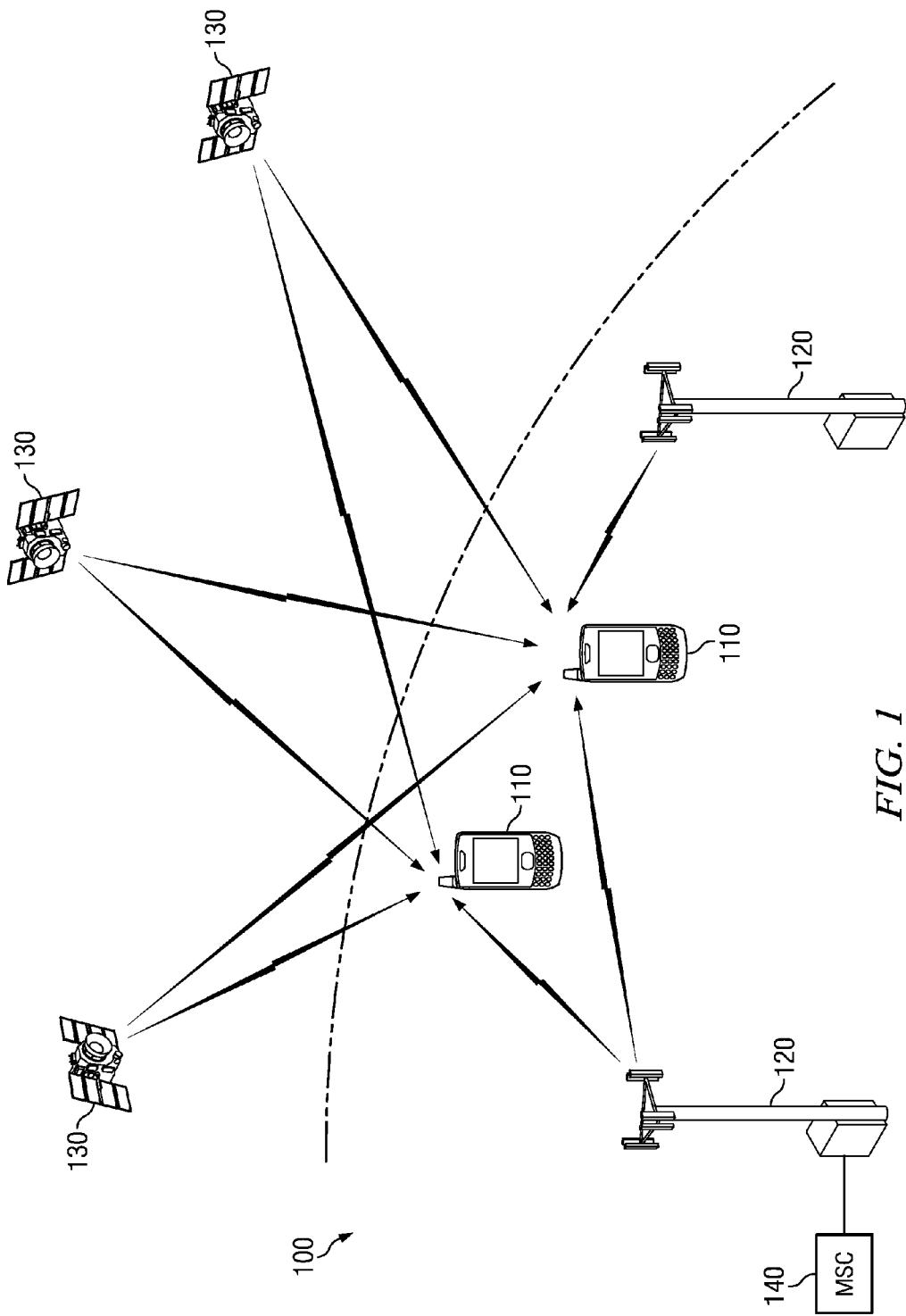
FIG. 1 illustrates a block diagram of an example wireless communication system, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1×"), IS-856 (also commonly known as "1×EV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
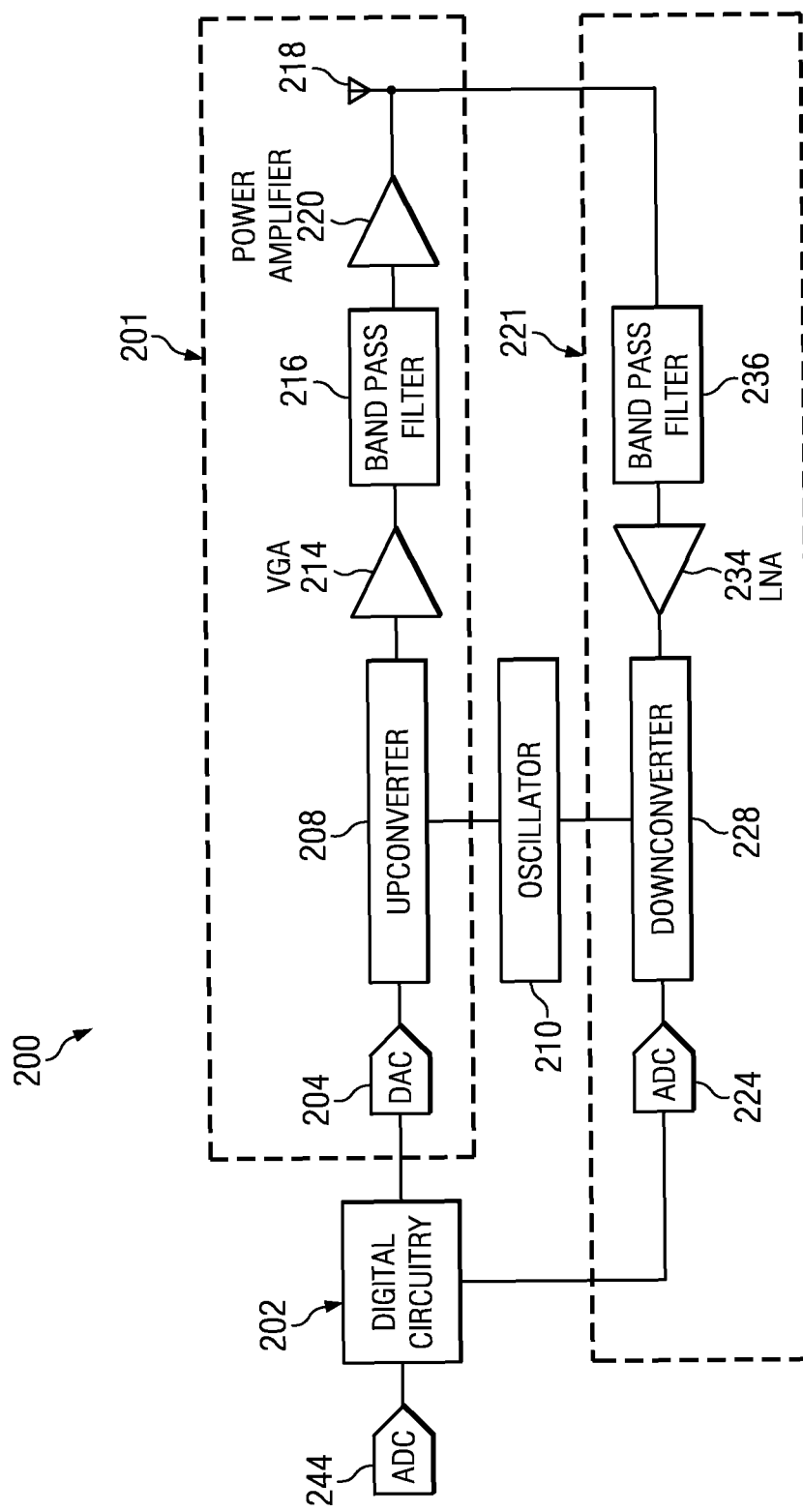
FIG. 2 illustrates a block diagram of selected components of an example transmitting and/or receiving element, in accordance with certain embodiments of the present disclosure.

FIG. 2 illustrates a block diagram of selected components of an example transmitting and/or receiving element 200 (e.g., a terminal 110, a base station 120, or a satellite 130), in accordance with certain embodiments of the present disclosure. Element 200 may include a transmit path 201 and/or a receive path 221. Depending on the functionality of element 200, element 200 may be considered a transmitter, a receiver, or a transceiver. In addition, in certain embodiments transmit path 201 may be considered a transmitter, while receiver path 221 may be considered a receiver.

As depicted in FIG. 2, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices.

As shown in FIG. 2, digital circuitry 202 may be communicatively coupled to an analog-to-digital converter (ADC) 244 configured to receive analog signals and convert such analog signals into digital signals. ADC 244 may be used by digital circuitry 202 for temperature measurements, monitoring of components of element 200, and/or other tasks. In some embodiments, ADC may comprise a continuous-time incremental ADC. ADC 244 is discussed in greater detail below with respect to FIGS. 3 and 4.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208.

Upconverter 208 may be configured to frequency upconvert an analog signal received from DAC 204 to a wireless communication signal at a radio frequency based on an oscillator signal provided by oscillator 210. Oscillator 210 may be any suitable device, system, or apparatus configured to produce an analog waveform of a particular frequency for modulation or upconversion of an analog signal to a wireless communication signal, or for demodulation or downconversion of a wireless communication signal to an analog signal. In some embodiments, oscillator 210 may be a digitally-controlled crystal oscillator.

Transmit path 201 may include a variable-gain amplifier (VGA) 214 to amplify an upconverted signal for transmission, and a bandpass filter 216 configured to receive an amplified signal VGA 214 and pass signal components in the band of interest and remove out-of-band noise and undesired signals. The bandpass filtered signal may be received by power amplifier 220 where it is amplified for transmission via antenna 218. Antenna 218 may receive the amplified and transmit such signal (e.g., to one or more of a terminal 110, a base station 120, and/or a satellite 130).

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifier (LNA) 234 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). In addition, downconverter 228 may be configured to output a current-mode analog signal as the downconverted signal.

Receive path 221 may further include an analog-to-digital converter (ADC) 224 configured to receive the current-mode analog signal from downconverter 228 and convert such analog signal into a digital signal. Such digital signal may then be passed to digital circuitry 202 for processing.

Figure 3:
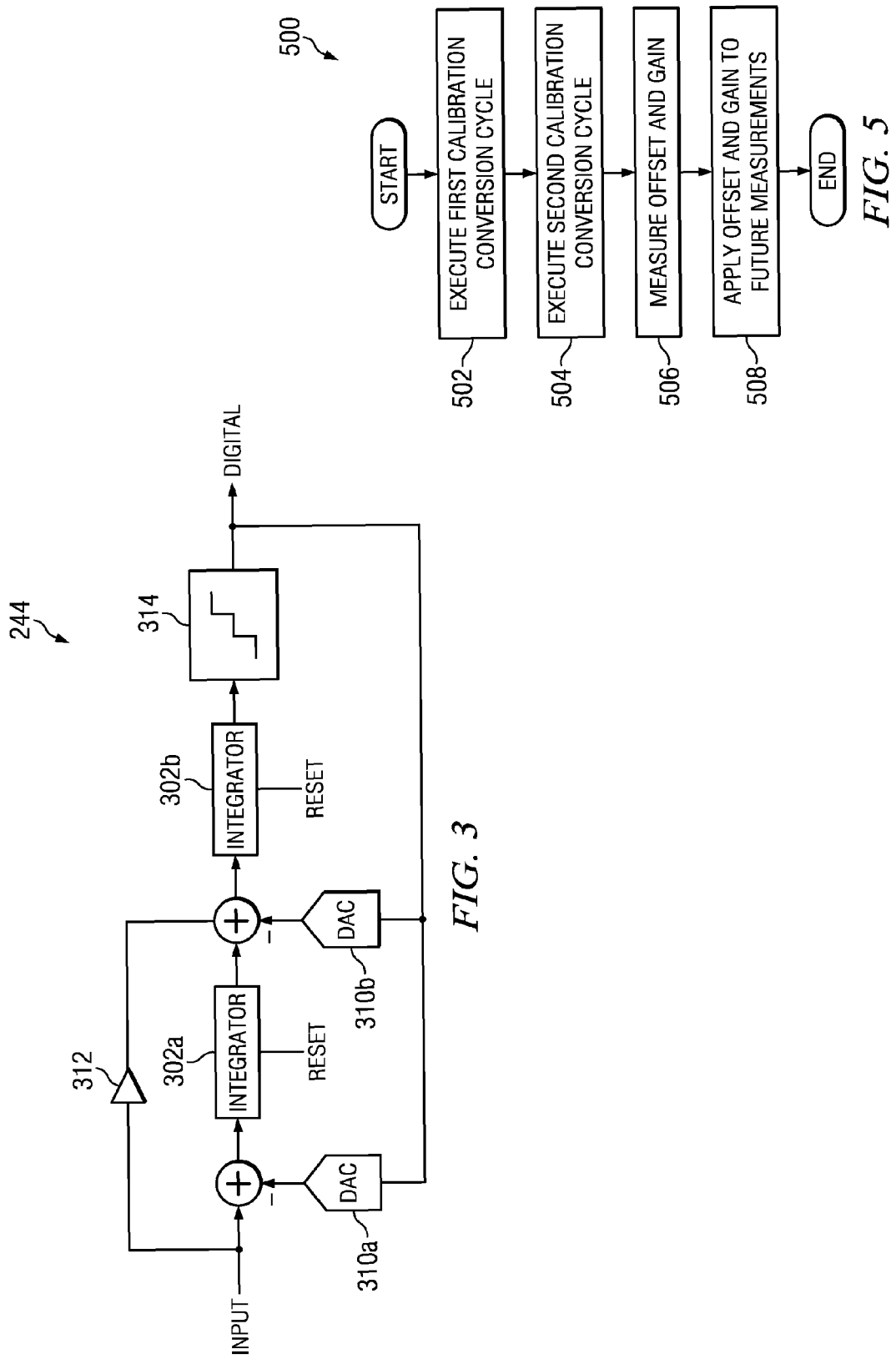
FIG. 3 illustrates a block diagram of an example continuous time incremental analog-to-digital converter, in accordance with certain embodiments of the present disclosure.

FIG. 3 illustrates a block diagram of an example continuous time incremental analog-to-digital converter 244, in accordance with certain embodiments of the present disclosure. As shown in FIG. 3, ADC 244 may include one or more integrators 302, one or more digital-to-analog converters 310, one or more gain elements 312 and a quantizer 314.

An integrator 302 may be any system, device, or apparatus configured to integrate, with respect to time, a signal received at its input. As shown in FIG. 3, integrators 302 may be arranged in a cascade configuration, such that the output signal from some of integrators 302 may be communicated to a subsequent integrator 302 in the cascade configuration. In FIG. 3, ADC 244 includes two integrators 302, meaning that the embodiment of FIG. 3 is implemented as a second-order delta-sigma modulator. It is understood that ADC 244 may be implemented in any suitable nth-order delta-sigma modulator (in which n is any suitable positive integer number), and thus include any suitable number of integrators 302. As shown in FIG. 3, an integrator may be a resettable integrator configured to reset after each analog input sample received by ADC 244.

Quantizer 314 may be any system, device, or apparatus configured to receive an analog signal (e.g., an analog voltage signal) and convert such analog signal to an x-bit digital signal (in which x is any suitable positive integer number). Such digital signal may be output by ADC 244 to digital circuitry 202.

The output signal of quantizer 314 may also be fed back to the inputs of one or more of the integrators 302. For example, as shown in FIG. 3, the digital output signal of quantizer 314 may be communicated to one or more DACs 310. A DAC 310 may be configured to receive the digital signal from quantizer 314 and convert such digital signal (e.g., a digital voltage signal) into an analog signal (e.g., an analog voltage signal). A DAC 310 may also be configured to communicate such signal to an input of an integrator 302, such that the DAC 310 output signal is summed with other signals communicated to the input of the integrator 302. To illustrate, the output signal of DAC 310a may be summed with the input signal to ADC 244, and input to integrator 302a. Similarly, the output signal of DAC 310*b* may be summed with the output signal of integrator 302*a* and input to integrator 302*b*.

In some embodiments, DACs 310 providing feedback to the last integrator 302 stage of an ADC 244 may be configured to provide for delay compensation for delays introduced by quantizer 314 or other components of ADC 244. Accordingly, in such embodiments, such DACs 310 (e.g., DACs 310*c* and 310*d* of FIG. 3) may delay their output by a certain duration from its input. In these and other embodiments, the individual delays of such DACs 310 may be different.

In some embodiments of ADC 244, ADC 244 may include one or more feedforward or feed-in paths, each such feed-in path comprising a gain element 312. A gain of the gain element 312 may be selected or configured such that the signal transfer function of ADC 244 is substantially matched to a discrete time ADC equivalent to ADC 244. To illustrate, those of skill in the art may appreciate that ADC 244 as shown in FIG. 3 may be modeled as a continuous time system with the following signal transfer function or feed-forward transfer function (assuming no feedback):

$$FF(s) = \frac{b_1}{s^2} + \frac{b_2}{s}$$

where $b_1$ is an input stage gain (gain between the input and the summing block between the input and integrator 302*a*), and $b_2$ is the gain of gain element 312. Assuming the input signal is held constant, the above transfer function can be transformed into the discrete time domain using the z-transform, and represented by:

$$FF_d(z) = b_1 \left[ \frac{0.5z^{-1} + 0.5z^{-2}}{(1-z^{-1})^2} \right] + b_2 \left[ \frac{z^{-1}}{1-z^{-1}} \right]$$

Those of skill in the art may also appreciate that a discrete time ADC may be modeled with the following signal transfer function:

$$FF(z) = \left[ \frac{z^{-2}}{(1-z^{-1})^2} \right]$$

Equating FFd(z) to FF(z) yields the following system of equations:

$$\begin{cases} b_1/2 + b_2 = 0 \\ b_1/2 - b_2 = 1 \end{cases}$$

Solving the above system of equations leads to the following values:

$$\begin{cases} b_1 = 1 \\ b_2 = -1/2 \end{cases}$$

Thus, by appropriately selecting a gain of gain element 312, the continuous-time ADC 244 may have a transfer function similar or identical to that of a discrete-time ADC. Accordingly, adding a feed-in path with gain element 312 may reduce conversion time of ADC 244 and render such conversion time similar to that of equivalent discrete time ADCs.

Figure 4:
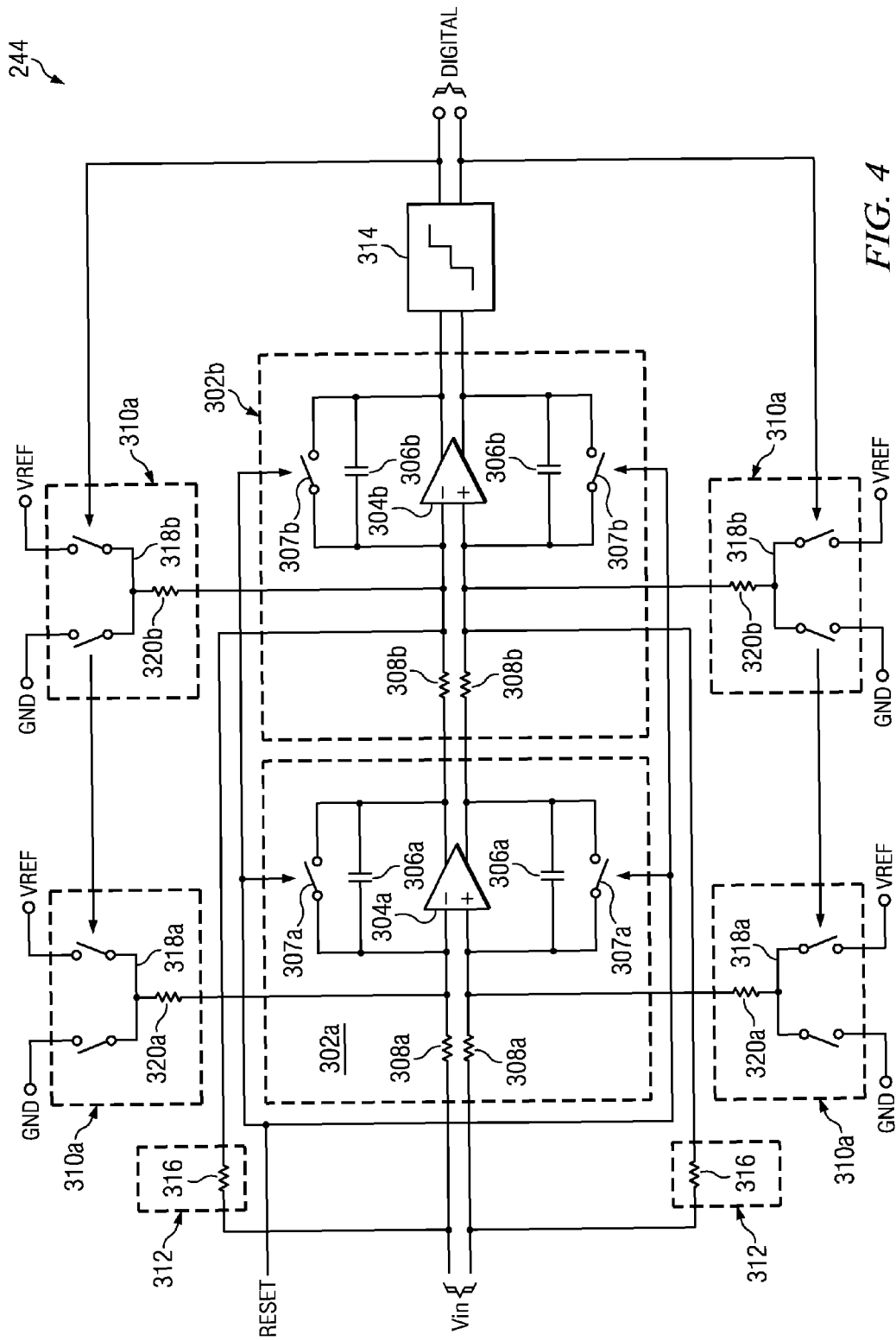
FIG. 4 illustrates an example circuit-level diagram of a example continuous time incremental analog-to-digital converter, in accordance with certain embodiments of the present disclosure.

FIG. 4 illustrates an example circuit-level diagram of certain embodiments of ADC 244 having a single-bit quantizer 314, in accordance with certain embodiments of the present disclosure. The embodiment depicted in FIG. 4 depicts an example ADC 244 having differential signal inputs. Embodiments for single-input ADCs may have fewer components in each modulator stage of ADC 244. As shown in FIG. 4, an integrator 302 may comprise an op amp integrator, including an operational amplifier 304, one or more capacitors 306, and one or more resistors 308. An operational amplifier 304 may be any system, device, or apparatus with a differential input and either a single-ended or differential output (a single-ended output is depicted in FIG. 4), which is a multiple of the voltage difference between the input terminals. A capacitor 306 may be an electronic component consisting of a pair of conductors separated by a dielectric, such that when there a potential difference exists across the conductors a static electric field develops in the dielectric that stores energy and produces a mechanical force between the conductors. A resistor 308 may be any electronic component that produces a voltage across its terminals that is proportional to the electric current passing through it in accordance with Ohm's law. A capacitor 306 may be coupled between the negative input terminal and the negative output terminal of an operational amplifier 304, while a capacitor 306 may be coupled between the positive input terminal and the positive output terminal of the operational amplifier 304. In addition, a resistor 308 may be coupled between the negative input of the integrator and the negative input terminal of an operational amplifier 304, while a resistor 308 may be coupled between the positive input of the integrator and the positive input terminal of an operational amplifier 304. In operation, an integrator 302 may receive a signal at its input and produce at its output a voltage signal representative of the integral of the input current signal with respect to time. A transfer function or gain of an integrator may be based on the resistance of its component resistors 308 and capacitors 306 (e.g., a resistor 308 and a corresponding capacitor 306 may have an RC characteristic that determines a gain or other characteristic of integrator 302).

As depicted in FIG. 4, integrators 302 may also include switches 307 in parallel with capacitors 306. Such switches 307 may be configured to close when a RESET signal is asserted, thus resetting the integrators 302.

As shown in FIG. 4, gain element 312 of a feed-in path of ADC 244 may be implemented as a resistor 316 interfaced between an input of ADC 244 and an input terminal of a operational amplifier 306 of an integrator 302. In embodiments including more than two integrators 302 (e.g., 3rd-order and higher ADCs 244), gain element paths 312 (and resistors 316 or other elements making up such paths) may be coupled between an input of ADC 244 and the input terminal of a operational amplifier 306 of any later-stage integrator 302 other than the first-stage integrator 302. In these embodiments, a resistance 316 of each gain element 312 of ADC 244 may be selected so as to match the signal transfer function, noise transfer function, and/or other characteristics of ADC 244 to a discrete-time equivalent ADC.

As shown in FIG. 4, feedback DACs 310 of ADC 244 may be implemented by resistors 320 and switches 318. Switches 318 may be configured to couple resistors 320 to a high voltage potential supply (e.g., VREF) when the output of quantizer 314 is positive, and couple resistors to a low voltage potential supply (e.g., GND) when the output of quantizer 324 is negative.

Although FIG. 4 depicts a particular architecture for ADC 244, other architectures are possible (e.g., architectures with feedforward paths coupled between the output of any integrator 302 and the input of any later-stage integrator 302, architectures employing multi-bit quantizers, etc.).

FIG. 5 illustrates a flow chart of an example method 500 for calibrating a continuous time analog-to-digital converter, in accordance with certain embodiments of the present disclosure. According to one embodiment, method 500 may begin at step 502. As noted above, teachings of the present disclosure may be implemented in a variety of configurations of element 200. As such, the preferred initialization point for method 500 and the order of the steps 502-508 comprising method 500 may depend on the implementation chosen.

At step 502, ADC 244 may execute a first calibration conversion cycle whereby a known input signal $x_1$ is applied to the input of ADC 244 and an output signal $y_1$ is measured (e.g., by digital circuitry 202 or another component of element 200).

At step 504, ADC 244 may execute a second calibration conversion cycle whereby a known input signal $x_2$ is applied to the input of ADC 244 and an output signal $y_2$ is measured (e.g., by digital circuitry 202 or another component of element 200).

At step 506, ADC may calculate a signal gain a and a signal offset β based on the calibration conversion cycle measurements made at steps 502 and 504. For example, the characteristic of ADC 244 have the characteristic y=αx+β, where y is an uncalibrated output signal measurement and x is an input signal. Thus, $y_1=\alpha x_1+\beta$ and $y_2=\alpha x_2+\beta$. Given that values $x_1$, $x_2$, $y_1$, and $y_2$ are known based on the measurements made in steps 502 and 504, the following system of equations then exists:

$$\alpha=(y_2-y_1)/(x_2-x_1)$$

$$\beta=(y_1 x_2-y_2 x_1)/(x_2-x_1)$$

and the signal gain α and signal offset β may be computed. As a specific example, consider that $x_1$ and $x_2$ are chosen such that $x_1=-x_2=x_{ref}$. In such a scenario:

$$\alpha=(y_2-y_1)/2x_{ref}$$

$$\beta=(y_1+y_2)/2$$

At step 508, the calculated signal gain and offset measurements may be applied to future measurements such that a measured output signal of ADC 244 may be appropriately modified by the determined signal gain and signal offset to correct for the signal gain and signal offset. For example, a calibrated output signal $y_{cal}$ may be given by the equation $y_{cal}=(y_{raw}-\beta)/\alpha$, where $y_{raw}$ is the uncalibrated output signal given by ADC 244.

Although FIG. 5 discloses a particular number of steps to be taken with respect to method 500, method 500 may be executed with greater or lesser steps than those depicted in FIG. 5. In addition, although FIG. 5 discloses a certain order of steps to be taken with respect to method 500, the steps comprising method 500 may be completed in any suitable order.

Method 500 may be implemented using element 200 or any other system operable to implement method 500. In certain embodiments, method 500 may be implemented partially or fully in software and/or firmware embodied in computer-readable media.

Modifications, additions, or omissions may be made to system 100 from the scope of the disclosure. The components of system 100 may be integrated or separated. Moreover, the operations of system 100 may be performed by more, fewer, or other components. As used in this document, "each" refers to each member of a set or each member of a subset of a set.

Although the present disclosure has been described with several embodiments, various changes and modifications may be suggested to one skilled in the art. It is intended that the present disclosure encompass such changes and modifications as fall within the scope of the appended claims.

What is claimed is:

1. A continuous-time incremental analog-to-digital converter (ADC), comprising:
   a plurality of resettable integrators, each integrator configured to convert a sum of signals received at its input to a signal indicative of an integral over time of the sum of signals, the plurality of integrators comprising at least:
      a first-stage integrator configured to receive at its input a baseband signal; and
      a final-stage integrator configured to produce at its output a final-stage analog signal;
      wherein the plurality of integrators are arranged in a cascade configuration such that an output of each of the plurality of integrators other than the final-stage integrator is coupled to the input of a subsequent integrator; and
   a feed-in gain element coupled between the input of the first-stage integrator and the input of another integrator of the plurality of integrators, the feed-in gain element configured such that a signal transfer function of the ADC is approximately equal to a signal transfer function of a discrete-time ADC equivalent to the ADC.

2. The ADC of claim 1, further comprising a quantizer configured to convert the final-stage analog signal to the digital output signal.

3. The ADC of claim 1, the ADC further comprising a plurality of digital-to-analog converters (DACs), each particular DAC associated with one of the plurality of integrators and configured to convert the digital output signal into a second current-mode signal such that the second current-mode signal is carried to the input of the integrator associated with the particular DAC.

4. The ADC of claim 1, the feed-in gain element comprising a resistor.

5. A wireless communication element, comprising:
   a transmit path configured to convert a first digital signal into a first modulated wireless communication signal and transmit the first modulated wireless communication signal;
   a receive path configured to receive a second modulated wireless communication signal and convert the second wireless communication signal into a second digital signal:
   a continuous-time incremental analog-to-digital converter (ADC), the ADC comprising:
      a plurality of resettable integrators, each integrator configured to convert a sum of signals received at its input to a signal indicative of an integral over time of the sum of signals, the plurality of integrators comprising at least:
         a first-stage integrator configured to receive at its input a baseband signal; and
         a final-stage integrator configured to produce at its output a final-stage analog signal;
         wherein the plurality of integrators are arranged in a cascade configuration such that an output of each of the plurality of integrators other than the final-stage integrator is coupled to the input of a subsequent integrator; and
      a feed-in gain element coupled between the input of the first-stage integrator and the input of another integrator of the plurality of integrators, the feed-in gain element configured such that a signal transfer function of the ADC is approximately equal to a signal transfer function of a discrete-time ADC equivalent to the ADC.

6. The wireless communication element of claim 5, the ADC further comprising a quantizer configured to convert the final-stage analog signal to the digital output signal.

7. The wireless communication element of claim 5, further comprising a plurality of digital-to-analog converters (DACs), each particular DAC associated with one of the plurality of integrators and configured to convert the digital output signal into a second current-mode signal such that the second current-mode signal is carried to the input of the integrator associated with the particular DAC.

8. The wireless communication element of claim 5, the feed-in gain element comprising a resistor.

\* \* \* \* \*

UNITED STATES PATENT AND TRADEMARK OFFICE
CERTIFICATE OF CORRECTION

PATENT NO.         : 8,698,664 B2
APPLICATION NO.    : 13/363884
DATED              : April 15, 2014
INVENTOR(S)        : Omid Oliaei et al.

It is certified that error appears in the above-identified patent and that said Letters Patent is hereby corrected as shown below:

On the title page, item (56), in column 2, References Cited under "Other Publications", line 1, delete ""Continous-time" and insert -- "Continuous-time --, therefor.

On the title page, item (56), in column 2, References Cited under "Other Publications", line 4, delete "continous-time" and insert -- continuous-time --, therefor.

On the title page, item (56), in column 2, References Cited under "Other Publications", line 7, delete "Anolog" and insert -- Analog --, therefor.

On the title page, item (56), in column 2, References Cited under "Other Publications", line 10, delete "Continous-Time" and insert -- Continuous-Time --, therefor.

Signed and Sealed this
Twenty-ninth Day of July, 2014

Michelle K. Lee
*Deputy Director of the United States Patent and Trademark Office*